United States Patent [19]

Sarraf

[11] Patent Number: 4,926,291
[45] Date of Patent: May 15, 1990

[54] DATA STORAGE MOUNTING ASSEMBLY
[75] Inventor: Mohammad Sarraf, Irvine, Calif.
[73] Assignee: Western Digital Corporation, Irvine, Calif.
[21] Appl. No.: 387,703
[22] Filed: Jul. 31, 1989
[51] Int. Cl.⁵ .............................................. H05K 7/20
[52] U.S. Cl. .................................... 361/384; 361/392; 361/424; 364/708
[58] Field of Search ............ 174/35 R; 361/383, 384, 361/394–395, 399, 424; 364/708, 408, 804

[56] References Cited

U.S. PATENT DOCUMENTS 4,717,216  1/1988  Hornak ............................... 361/399
4,744,005  5/1988  Milani ................................ 361/384

Primary Examiner—Gregory D. Thompson
Attorney, Agent, or Firm—Christie, Parker & Hale

[57] ABSTRACT

An external disk drive assembly includes a molded plastic base; a sheet metal frame latched to the base; a power supply housing, a disk drive housing, and a disk drive controller card affixed to the frame; a forced air cooling fan mounted in a molded receptacle on the base; a cover removably secured to the base; and thin sheet metal plates inside the cover and base to provide electrical grounding and EMI and RFI shielding. The receptacle has oppositely-facing U-shaped walls matching the outer configuration of the fan housing. The sheet metal base has a retaining flange for extending over the fan housing. During assembly, the fan housing is simply dropped into the receptacle so the outer walls of the receptacle locate the fan housing relative to the base and frame. The frame is then latched to the base which locates the retaining flange over the top of the fan housing. The flange can carry a resiliently compressible shock and vibration isolator for contacting the fan housing to keep the housing in place and to prevent fan vibrations from being induced from the rotating fan blades into the frame. The fan housing is assembled in its operative shock and vibration-isolating position without external tools or fasteners. The invention provides advantages of reducing assembly time and labor costs and improving assembly reliability.

14 Claims, 3 Drawing Sheets

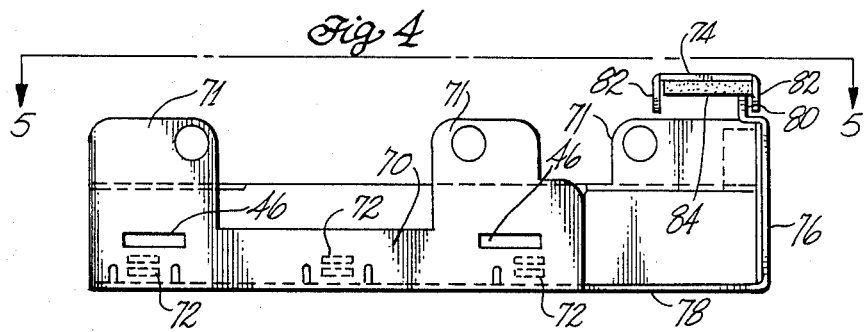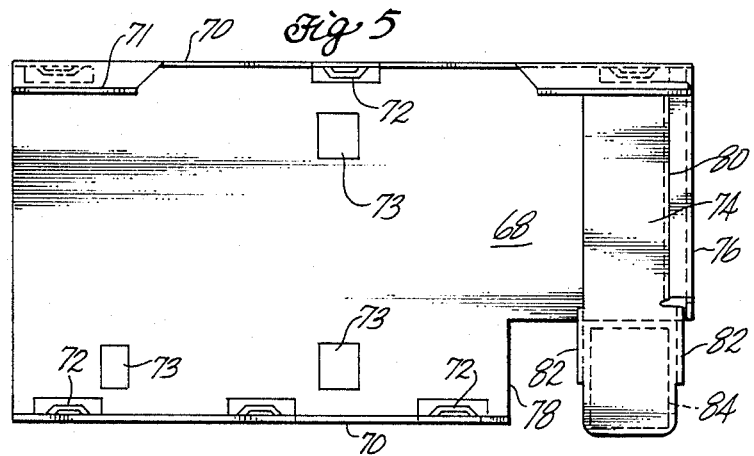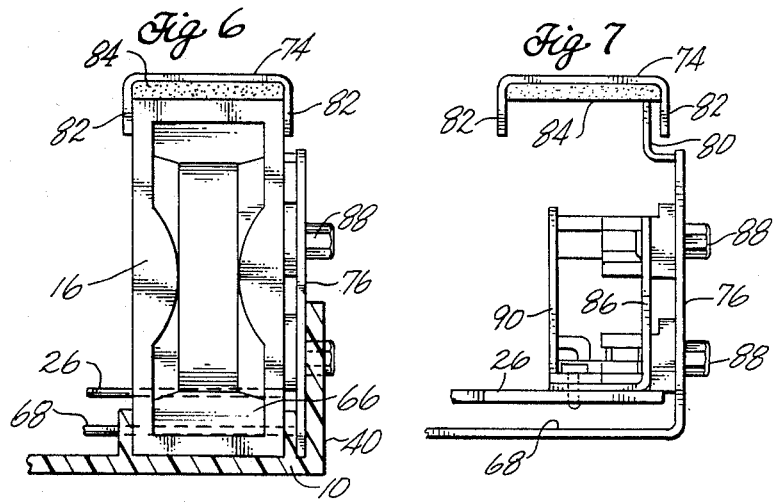

DATA STORAGE MOUNTING ASSEMBLY

FIELD OF THE INVENTION

This invention relates to disk drives for computers or similar data storage devices, and more particularly, to an improved means for assembling components in a disk drive or other data storage device enclosure.

BACKGROUND OF THE INVENTION

Disk drive computer memory devices typically have a data storage medium in the form of a disk rotatably driven at high speeds, and a read/write head to read data from or write data on the disk. A typical external disk drive used as a peripheral memory device for personal computers includes a hard disk unit mounted to a frame within the disk drive enclosure, along with a disk drive controller card. A power supply and a forced-air cooling fan also are assembled in the disk drive housing.

A substantial amount of heat is generated internally within the disk drive housing during use, and operation of the fan dissipates the heat that develops within the housing. The fan vibrates under steady operation, and therefore, the fan is fastened to the mounting frame in the disk drive housing so that fan vibrations are not induced into the frame. Any undue shock or vibration imparted to the disk drive unit can result in loss of data or read/write errors in information recorded on the disk. A typical fan housing is made of plastic and has molded passages through which separate fasteners are inserted to fasten the fan inside the housing. These fasteners include separate screws, nuts and washers. Fan vibration can sometimes loosen the fasteners which secure the fan housing in the disk drive enclosure.

Assembly costs and reliability are important factors influencing the design of disk drive components and the techniques for assembling them in the disk drive enclosure. There is an on-going need to ensure that the components of the disk drive are designed and assembled in such a way that labor assembly costs are reduced and assembly reliability is improved.

SUMMARY OF THE INVENTION

Briefly, one embodiment of the present invention provides a disk drive mounting enclosure in which all major components of the disk drive are assembled in their functional positions within the enclosure without the need for external tools or fasteners. In one embodiment of the invention, a forced-air fan in the disk drive housing is mounted to isolate shock and fan vibration without the need for external tools or fasteners.

The invention is described below principally in relation to its use in a disk drive used as a peripheral data storage device for personal computers. However, the invention is adapted for use in a variety of data storage devices including, but not limited to, hard disk and floppy disk drives, optical disk drives and data tape back-up units.

Briefly, one embodiment of the invention includes an enclosure having a base and a receptacle having side walls integral with the base and projecting from the base. The receptacle is configured to fit around a forced-air fan housing so the fan is contained on the base by the surrounding walls of the receptacle. A mounting frame carried on the base mounts a disk drive or other data storage device in the housing. The fan housing is disposed in the receptacle without a rigid means of attachment either to the base or frame. For instance, during assembly, the fan housing can be simply dropped into the receptacle which precisely locates the fan relative to the base and frame. The mounting frame is then latched to the base adjacent to the fan housing. A retaining means on the mounting frame engages the fan housing to retain the fan in the receptacle when the frame is latched to the base. During use, the fan can be operated under conditions sufficient to cool the disk drive or other data storage components, and the fan mounting means retains the fan in its operative position during use without external shock being transmitted to the fan or fan operation inducing undesired vibrations to the frame or any other component of the disk drive or other data storage unit.

In one embodiment of the invention, the fan retaining means can comprise an elongated retaining arm or flange which extends from the frame over the fan housing to retain the fan in its receptacle. A shock and vibration isolation means between the flange and the fan housing dampens fan vibrations when the fan is operated to cool the disk drive. The isolation means can comprise a shock absorbing medium adhered to the flange without external rigid means of attachment. The flange is arranged for positioning the shock absorbing means in its operative position on the fan housing when the frame is properly latched to the base.

Thus, the invention provides a means for quickly and easily assembling the fan in the data storage enclosure in a proper functional position with respect to other functional components of the data storage device. By avoiding the need for external tools and fasteners, assembly reliability is improved and a significant reduction in labor assembly costs is produced.

These and other aspects of the invention will be more fully understood by referring to the following detailed description and the accompanying drawings.

BRIEF DESCRIPTION OF THE DRAWINGS

FIG. 4 is a side elevational view of a mounting frame for the disk drive unit;

FIG. 5 is a top plan view taken along 5—5 of FIG. 4;

FIG. 6 is a fragmentary side elevational view, partly in cross-section, illustrating a means of shock mounting and vibration isolation for a fan housing contained in the disk drive enclosure; and FIG. 7 is a fragmentary side elevational view illustrating a means for electrically connecting and grounding a printed circuit board mounted to the frame.

DETAILED DESCRIPTION

Figure 1:
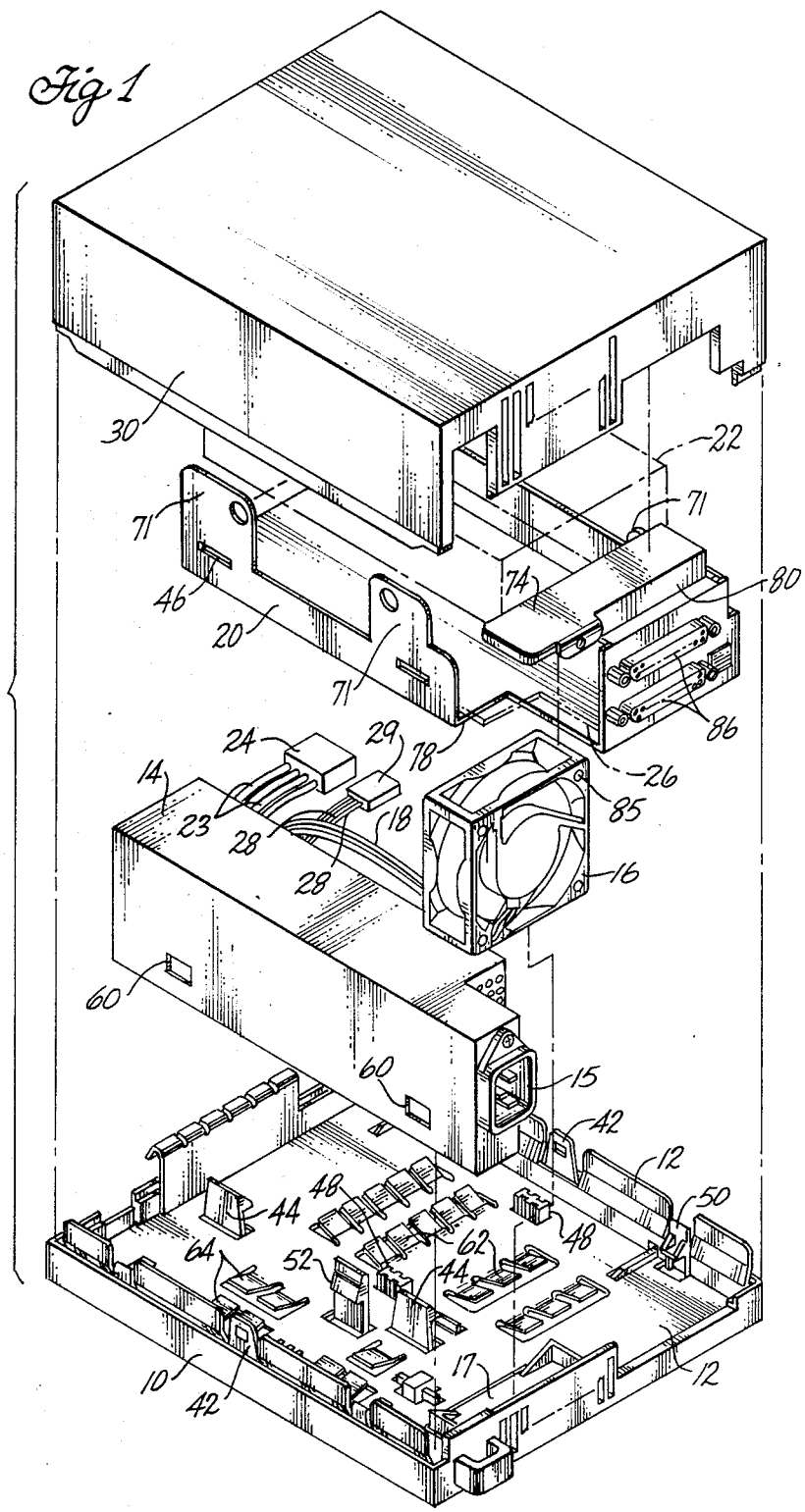
FIG. 1 is an exploded perspective view illustrating components of an external disk drive enclosure according to principles of this invention.

FIG. 1 is an exploded perspective view illustrating components of an external disk drive of the type which provides a peripheral memory device for a personal computer. In the illustrated embodiment, the disk drive can be a 20-megabyte or 40-megabyte external hard disk drive that connects to personal computers, such as the MacIntosh product line and Apple II computers, through the usual SCSI port. As mentioned previously, the illustrated disk drive is an example of a computer data storage device with which the invention can be used. The disk drive housing includes a molded plastic base 10 and a sheet metal electrical ground and shield 12 covering inside faces of the base 10. A power supply housing 14 mounts to a portion of the base through connectors on the base fastened to the power supply housing. The power supply housing includes a receptacle 15 for connection to a conventional AC power line. A forced-air fan 16 is mounted in a receptacle 17 on the molded plastic base 10. A pair of electrical connectors 18 electrically connect the forced-air fan to the power supply. A sheet metal mounting frame or chassis 20 latches to the base 10 through connectors on the base releasably engaged with cooperating connectors on the chassis. A hard disk drive unit (shown in phantom lines at 22) is mounted to the metal frame 20. The hard disk drive is electrically connected to the power supply through a set of electrical wires 23 and a connector 24. A disk drive controller card (shown in phantom lines at 26) is affixed to the metal frame 20 below the disk drive housing 22. The controller card is electrically connected to the power supply through a set of electrical wires 28 and a connector 29.

The frame 20 provides means (not shown) for electrically grounding controller card 26.

Alternatively, the controller can be integrated into the electronics contained within the disk drive unit. A generally rectangular cover 30 opens downwardly and fits over the assembled components within the hard disk drive enclosure. A sheet metal electrical ground and shield (not shown) contained in the interior of the enclosure cover releasably contacts corresponding metal connectors on the ground-shield 12 of the base 10 for forming a three-dimensional metallic electrical ground and shield in a "cube" form surrounding the components of the disk drive.

Figure 2:
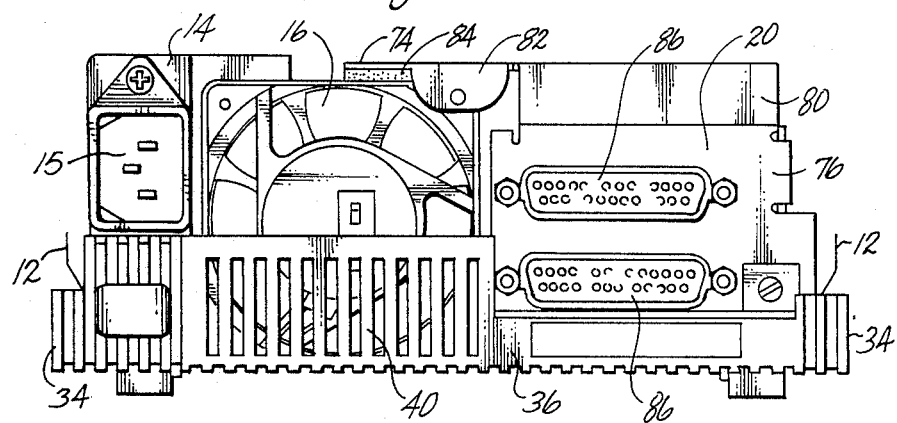
FIG. 2 is an end elevational view of an assembled disk drive with the cover removed to reveal internal components of the disk drive.
Figure 3:
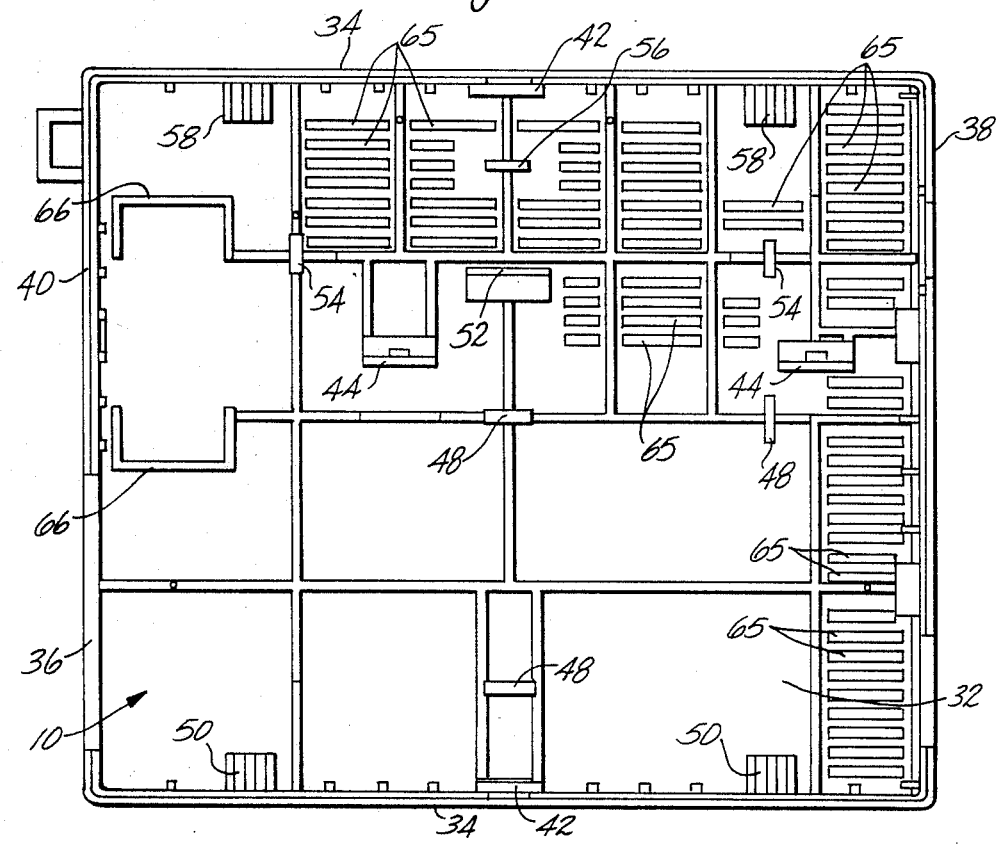
FIG. 3 is a top plan view of a molded plastic base of the enclosure.

FIGS. 2 and 3 best illustrate the molded plastic base 10. FIG. 1 schematically illustrates the base with the sheet metal electrical ground-shield 12 attached to the inside of the base. FIG. 3 illustrates the base without the ground-shield. FIG. 2 is a side elevation of the base with components of the disk drive assembled on the base. These components include the power supply 14, the fan housing 16, and the disk drive mounting frame 20.

Referring principally to FIG. 3, the molded plastic base 10 has a generally rectangular, flat inside face 32, with upright sidewalls 34 along opposite sides of the base, and upright rear and front walls 36 and 38 along front and rear edges of the base. The rear wall 36 includes a fan housing grill 40 which fronts the fan housing when the fan is assembled on the base. A pair of upright side latches 42 on opposite sides of the base are used for closing the top and bottom of the enclosure. A pair of upright bendable mounting frame latches 44 are spaced apart axially along the inside of the base. These latches are used to releasably affix the frame to the base without the need for external tools or fasteners (screw drivers, rivets, screws, etc.). These latches have a groove at the top of a top flange for engaging spaced apart slots 46 (see FIGS. 1 and 4) in the side wall of the frame 20. In the illustrated embodiment, there are also preferably three short rigid alignment support posts 48 projecting upwardly from the flat inside face 32 of the base. These posts 48 engage corresponding openings (not shown) in the bottom of the frame to hold the frame in place during assembly. These posts also can provide shock mounting of the frame. A pair of axially spaced apart side stands 50 project upwardly from the side wall of the base adjacent to which the frame is mounted. These side stands engage corresponding openings (not shown) on the side wall of the frame for securing the frame to the base.

When mounting the frame 20 to the base 10, one side of the frame is first engaged with side stands 50 which act as pivot points so the frame can rotate downwardly and latch to the flanged upper portions of the latches 44. To remove the frame the latches 44 are released from the slots 46 in the frame side wall, and the frame can pivot away from the base, pivoting about an axis through the side stands 50.

Thus, the mounting frame with its attached disk drive and disk drive controller card can be quickly and easily latched to the base in a fixed but removable shock-mounted position without the need for external tools or fasteners.

The molded plastic base further includes an elongated, bendable power supply latch 52 projecting upwardly from the inside face of the base. The latch 52 is spaced inwardly from the side wall adjacent to which the power supply is mounted. The latch 52 releasably latches to a slotted opening (not shown) in the side of the power supply housing. The inside face of the base also includes a pair of short, rigid, upright and axially spaced apart alignment posts 54 with grooved upper surfaces for latching to corresponding locations in the bottom of the power supply housing. The base also includes a short, rigid, upright alignment post 56 which also supports the bottom of the power supply housing along with the alignment posts 54. A pair of axially spaced apart and bendable upright side stands 58 project from the side wall of the base adjacent to the power supply housing. The side stands 58 engage corresponding slotted openings 60 in the side wall of the power supply housing. These side stands function similarly to the side stands 50 in that they provide a support about which the power supply housing can pivot when assembling the power supply to or releasing it from its latched position on the latch 52.

Thus, the power supply housing also is rigidly affixed to the base in a releasable and shock-mounted position without the use of external tools or fasteners.

The ground-shield 12 includes a first set of resilient metal fingers 62 which project upwardly into the interior of the base where the metal frame 20 is mounted. These resilient fingers provide a means of resilient electrically conductive contact between the shield and the bottom of the sheet metal base to provide a ground connection between the ground-shield 12 and frame 20. Similarly, a second set of resiliently bendable fingers 64 on the ground-shield 12 project upwardly into the interior of the base where the power supply housing is mounted for resilient, electrically conductive contact between the fingers and the bottom of the power supply housing. This provides a ground connection between the power supply housing 14 and the ground-shield 12.

The molded plastic base also includes selectively positioned open louvers 65 for cooling purposes. The louvers are positioned principally below the power supply and along the rear wall of the base.

As described previously, the molded plastic base includes the receptacle 17 for mounting the fan housing 16 to a rear portion of the base behind the grill 40. The fan housing receptacle is formed by a pair of laterally spaced apart and generally U-shaped side walls 66 which open toward each other and face one another to form opposite ends of the receptacle. These U-shaped walls 66 are integral with and project upwardly from the flat face of the molded plastic base, and the U-shaped walls are configured and arranged so they match the outer contour of the fan housing. During assembly, the fan housing can simply be dropped into the receptacle formed by the U-shaped walls 66 to provide a means for precisely locating the fan housing on the base. The fan is not otherwise rigidly affixed to the base or any other component of the disk drive by rigid fastening means or the like, nor are any external tools needed for assembling the fan housing to the base.

FIGS. 4 and 5 best illustrate the configuration of the disk drive mounting frame 20, which includes a sheet metal frame having a flat base 68 and a pair of side walls 70 extending axially and projecting upwardly along opposite sides of the base. The side walls having rigid mounting brackets 71 used for mounting the disk drive unit 22 to the frame. The mounting frame 20 also includes axially spaced apart and inwardly projecting mounting tabs 72 which project inwardly along the opposite side walls of the frame. These mounting tabs are aligned axially and are spaced apart at uniform elevations for removably mounting the disk drive controller card 26 to a lower portion of the frame, below the disk drive unit. In embodiments in which the controller may be integrated into the disk drive unit 22, the mounting tabs 72 can be used for mounting other printed circuit boards such as for power, logic, LED control, switching functions, or the like. Openings 73 in the bottom of the frame are engaged by the alignment posts 48 on the molded plastic base when latching the frame to the base.

The mounting frame 20 also includes an elongated fan housing retaining arm or flange 74 spaced above the base of the frame and extending along the front edge of the frame. The flange 74 is integrally formed with the sheet metal frame 20 which also includes an elongated upright front wall 76 bent at a right angle relative to the flat base 68 of the frame. Frame 20 provides EMI and RFI shielding and an electrical ground connection (not shown) to the disk drive 22. The base of the metal frame is generally rectangularly shaped, except for a small rectangular notch 78 at the rear corner of the frame which fits around the fan housing receptacle and the fan housing during assembly. This notched portion shortens the width of the frame at its rear, and the rear wall 76 projects upwardly from this shortened rear edge of the frame. The flange is bent at a right angle relative to the top of the rear wall 76 so that the flange is spaced above and extends parallel to the flat base of the frame. The flange 74 is longer than the front wall 76 so that an extension of the flange extends away from the front wall to form a retaining arm that extends over the top of the fan housing 16 when the fan is assembled in the receptacle 17. The flange is generally inverted U-shaped or channel-shaped in cross section, and includes a long narrow side wall 80 spaced inwardly from the top of the front wall of the frame. The flange also includes a pair of downwardly extending and parallel side tabs 82 which project along opposite sides of the fan when the fan is assembled in the receptacle. Thus, when the fan housing is mounted in the fan housing receptacle, and the mounting frame is latched to the molded plastic base, the flange extends over the top of the fan housing. This configuration is best shown in FIGS. 2, 6 and 7.

A shock isolator 84 is affixed to the underside of the flange 74, along the portion of the flange which extends over the top of the fan housing. The shock isolator is a resilient means for isolating the fan from external shock on the disk drive and for absorbing any vibrational energy generated by the fan during use when operated to cool the inside of the disk drive housing. This isolator prevents or at least greatly dampens fan vibrations that may be induced in the disk drive mounting frame 20 or any other disk drive during operation of the disk drive. The flange and shock isolator apply resilient pressure to the top of the fan housing to also retain the fan in the housing without any rigid means of attachment between the frame and the fan housing. In a preferred embodiment, the shock isolator comprises an elongated, resiliently compressible elastomeric strip in the form of a double-coated tape adhered to the underside of the flange and to the top of the fan housing.

In an alternative embodiment, the flange 74 can serve as a fan retaining means without use of the compressible shock and vibration isolator 78. In this instance, the flange is positioned closer to the top of the fan so that when the mounting frame 20 is assembled by latching it to the molded base, the flange can engage and apply pressure to the top of the plastic fan housing. This retains the fan in the receptacle and also dampens fan vibrations substantially.

The side tabs 82 are optional and can be used in instances where the fan may generate substantial vibration. The holes in the tabs 82 are aligned with one of the molded passages 85 in the fan housing (see FIG. 1), and an external fastener (not shown) can be used in this instance to rigidly affix the fan to the flange 74.

FIGS. 6 and 7 are side elevational views better illustrating the flange 74 and its relationship to the fan housing and the other components of the disk drive unit. FIG. 6 shows the fan housing 16 mounted in the fan housing receptacle between the U-shaped end walls 66 of the receptacle. This view also illustrates the shock isolator 84 in contact between the flange 74 and the top of the fan housing.

As best illustrated in FIG. 7, the rear wall of the frame mounts a pair of conventional SCSI interface receptacles 86 for use in connecting the external hard disk drive to conventional SCSI ports of the computer. The SCSI interfaces are best shown in FIGS. 1 and 2. The data storage enclosure also can have other interfaces depending upon the type of data storage device contained in the enclosure.

A pair of L-shaped metal brackets 87 fasten a front portion of the disk drive controller card to the front wall of the frame. Bottom legs of the brackets are affixed to the PCB and upright legs of the brackets are affixed to the inside wall of the frame by a set of four fasteners 88. The SCSI interface receptacles communicate through a passive circuit board 90 providing electrical circuit continuity between each input terminal of one SCSI interface and a corresponding terminal on the other SCSI interface. The connection between the fasteners 88, the brackets 87 and the PCB provide a means for grounding the PCB to the frame. The fasteners 88 also have internally threaded holes at their front adapted to receive corresponding fasteners (not shown) for securing a computer cable to the SCSI interface.

Thus, the invention does not require any external fasteners or tools to secure the fan to the chassis. The fan housing is simply dropped into the fan housing receptacle, and the mounting frame is then assembled to the molded plastic base and latched in place, which automatically positions the flange of the frame over the top of the fan housing. This assembly step also automatically engages the top of the fan housing with the shock isolator or the flange. The flange and shock isolator keep the fan housing in place and dampen any vibration that may be induced from the fan blades into the mounting frame. The invention provides a significant reduction in labor assembly cost since no external fasteners or tools are required for assembly. The invention also provides an improvement in assembly reliability since there are fewer parts to assemble. Factory inventory improvements also result from less parts to count or handle.

What is claimed is:

1. A data storage assembly comprising:
    a base;
    a receptacle having side walls integral with the base and projecting from the base, the receptacle being configured to fit around a portion of a fan housing so the fan housing is releasably contained on the base by surrounding walls of the receptacle;
    a frame carried on the base and having a flange for extending over the fan housing; and
    shock and vibration isolation means between the flange and the fan housing for dampening shock and fan vibrations when the fan contained in the fan housing is operated under conditions sufficient to cool electrical power consuming components carried on the base without significant vibrational energy being transmitted from the fan housing to the frame under normal operation of a data storage device mounted to the frame.

2. Assembly according to claim 1 in which the fan housing is disposed in the receptacle without a rigid means of attachment between the fan housing and the base or frame.

3. Assembly according to claim 2 in which the base includes means for releasably latching to the frame for holding the frame in a fixed position relative to the base, wherein the frame in said fixed position operatively positions the flange relative to the fan housing.

4. Assembly according to claim 1 in which the shock isolation means comprises an elastomeric strip compressed between the flange and fan housing.

5. Assembly according to claim 1 in which the data storage unit comprises a computer disk drive.

6. A data storage enclosure comprising:
    a base;
    a receptacle having side walls integral with the base and projecting from the base, the receptacle being configured to fit around a portion of a fan housing so the fan housing is contained on the base by the surrounding walls of the receptacle; and
    a frame carried on the base and having means for mounting a data storage device internally in the enclosure and a retaining arm for extending over and into contact with the fan housing for containing the fan housing within the receptacle, in which the fan housing is disposed in the receptacle without a rigid means of attachment of the fan housing to the base, frame or the retaining arm.

7. Enclosure according to claim 6 including means for releasably latching the frame to the base in a fixed position which locates the retaining arm relative to the fan housing.

8. Enclosure according to claim 6 including a resiliently compressible shock and vibration isolation means between the retaining arm and the fan housing.

9. Enclosure according to claim 6 in which the retaining arm is an integral portion of the frame which is a sheet metal piece providing EMI and RFI shielding and an electrical ground connection for a data storage device.

10. Enclosure acccording to claim 6 in which the retaining arm applies pressure to the top of the fan housing to retain the fan housing in the receptacle.

11. Apparatus, according to claim 9 in which the data storage device comprises a computer disk drive.

12. A data storage enclosure comprising:
    a base;
    a forced-air fan contained in a fan housing;
    a receptacle having side walls integral with the base and projecting from the base, the receptacle being configured to fit around a portion of the fan housing so the fan housing is contained on the base by the surrounding walls of the receptacle; and
    a mounting frame carried on the base to mount a data storage device internally within the enclosure and provide an electrical ground connection and a level of EMI and RFI shielding for the data storage device, the frame further including a retaining means spaced above the base and extending adjacent the fan housing positioned in the receptacle, to provide a means for retaining the fan housing in the receptacle;
    the fan housing being disposed in the receptacle without a rigid means of attachment of the fan housing to the base, frame or retaining means.

13. Enclosure according to claim 12 in which the data storage device comprises a computer disk drive.

14. Enclosure according to claim 12 in which a controller card for the data storage device is mounted to the frame, and the frame provides a means for electrically grounding the controller card.

* * * * *